(12) United States Patent
Snowdon et al.

(10) Patent No.: US 9,812,440 B2
(45) Date of Patent: Nov. 7, 2017

(54) BIASED ESD CIRCUIT

(71) Applicant: Fairchild Semiconductor Corporation, San Jose, CA (US)

(72) Inventors: Kenneth P. Snowdon, Falmouth, ME (US); Taeghyun Kang, Scarborough, ME (US); Yongliang Li, Beijing (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 22 days.

(21) Appl. No.: 14/834,554

(22) Filed: Aug. 25, 2015

(65) Prior Publication Data

US 2016/0064374 A1    Mar. 3, 2016

Related U.S. Application Data

(60) Provisional application No. 62/043,873, filed on Aug. 29, 2014.

(51) Int. Cl.
*H02H 9/04* (2006.01)
*H01L 27/02* (2006.01)

(52) U.S. Cl.
CPC ......... *H01L 27/0266* (2013.01); *H02H 9/046* (2013.01)

(58) Field of Classification Search
CPC .............................. H01L 27/0266; H02H 9/046
USPC ........................................................ 361/56
See application file for complete search history.

(56) References Cited

U.S. PATENT DOCUMENTS

| | | | |
|---|---|---|---|
| 6,724,592 B1* | 4/2004 | Tong | H01L 27/0266 361/111 |
| 7,196,887 B2* | 3/2007 | Boselli | H01L 27/0266 257/E29.266 |
| 2003/0081461 A1* | 5/2003 | Yamauchi | G11C 7/1078 365/189.09 |
| 2006/0044716 A1* | 3/2006 | Kuo | H01L 27/0266 361/56 |
| 2007/0121262 A1* | 5/2007 | Loh | H01L 27/0266 361/56 |
| 2008/0043388 A1* | 2/2008 | Kohama | H01L 27/0251 361/56 |

FOREIGN PATENT DOCUMENTS

| CN | 105391439 A | 3/2016 |
|---|---|---|
| KR | 1020160026759 A | 3/2016 |

* cited by examiner

*Primary Examiner* — Scott Bauer
(74) *Attorney, Agent, or Firm* — Brake Hughes Bellermann LLP

(57) ABSTRACT

This document discusses, among other things, a biased electrostatic discharge (ESD) circuit and method configured to reduce capacitance of an ESD structure with little to no change in other ESD structure parameters. A bulk terminal of an ESD device can be negative biased to reduce a drain terminal to source terminal capacitance of the ESD device. A charge pump can be configured to provide a negative bias to the bulk terminal of the ESD device. In certain examples, the gate terminal of the ESD device can be coupled to the source terminal of the ESD device, such as through a resistor, and the source terminal can be coupled to ground.

17 Claims, 4 Drawing Sheets

BIASED ESD CIRCUIT

CLAIM OF PRIORITY

This application claims the benefit of priority under 35 U.S.C. §119(e) of Kenneth P. Snowdon et al. U.S. Provisional Patent Application Ser. No. 62/043,873, titled "BIASED ESD CIRCUIT," filed on Aug. 29, 2014, which is incorporated by reference herein in its entirety.

BACKGROUND

Electrostatic discharge (ESD) is the sudden flow of charge between objects. In certain examples, ESD current can be large enough to damage electronic devices. To protect electronic devices from ESD events, various ESD protection circuits have been designed to shunt ESD current to ground.

OVERVIEW

This document discusses, among other things, a biased electrostatic discharge (ESD) circuit and method configured to reduce capacitance of an ESD structure with little to no change in other ESD structure parameters. A bulk terminal of an ESD device can be negative biased to reduce a drain terminal to source terminal capacitance of the ESD device. A charge pump can be configured to provide a negative bias to the bulk terminal of the ESD device. In certain examples, the gate terminal of the ESD device can be coupled to the source terminal of the ESD device, such as through a resistor, and the source terminal can be coupled to ground.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a bias voltage can be applied to an electrostatic discharge (ESD) structure, such as to a well or a gate in the ESD structure, to reduce the capacitance of the ESD structure, with little to no change in other ESD structure parameters.

Figure 1:
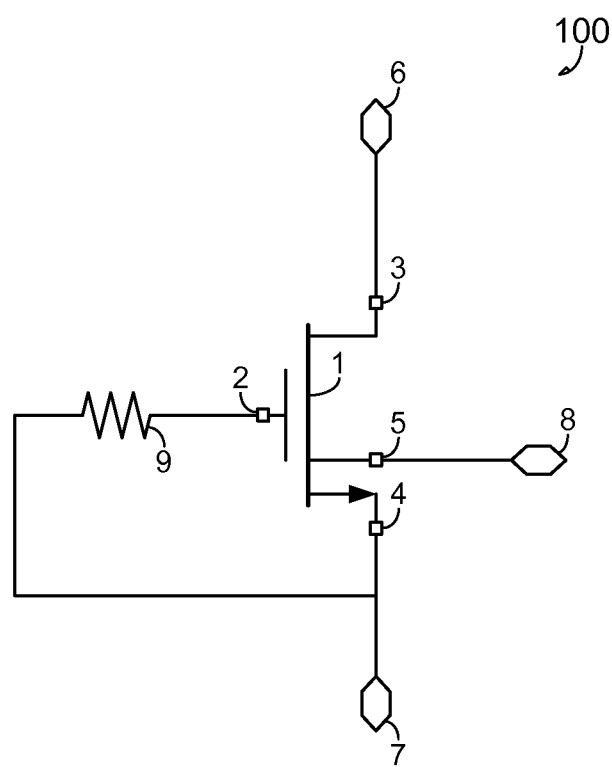
FIGS. 1-3 illustrate generally example biased electrostatic discharge (ESD) circuits.
Figure 2:
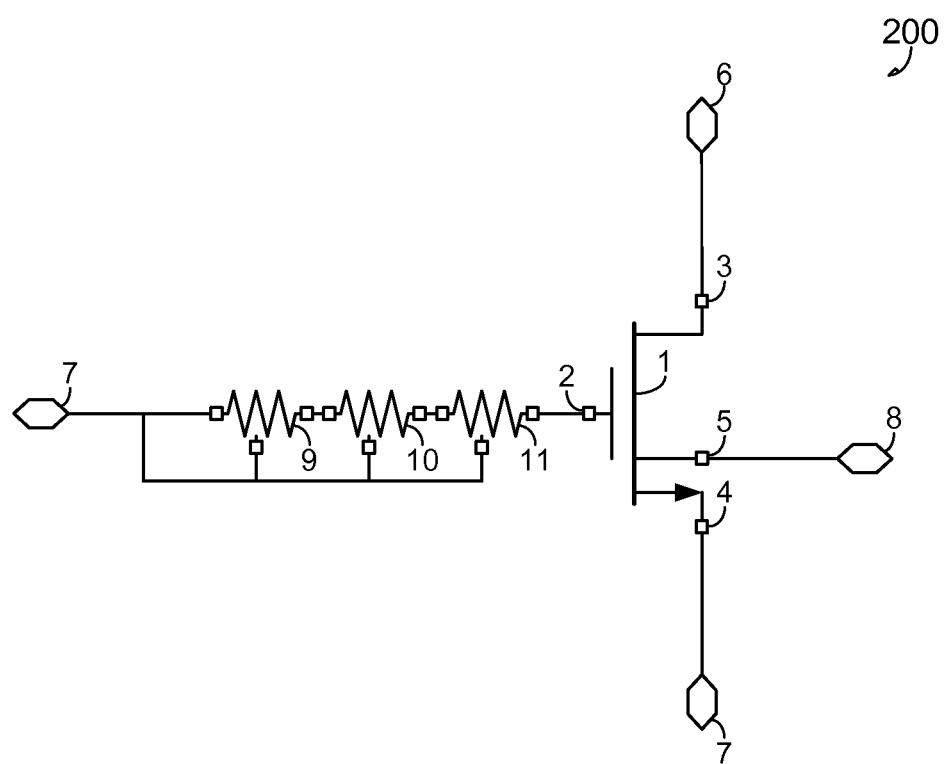
Figure 3:
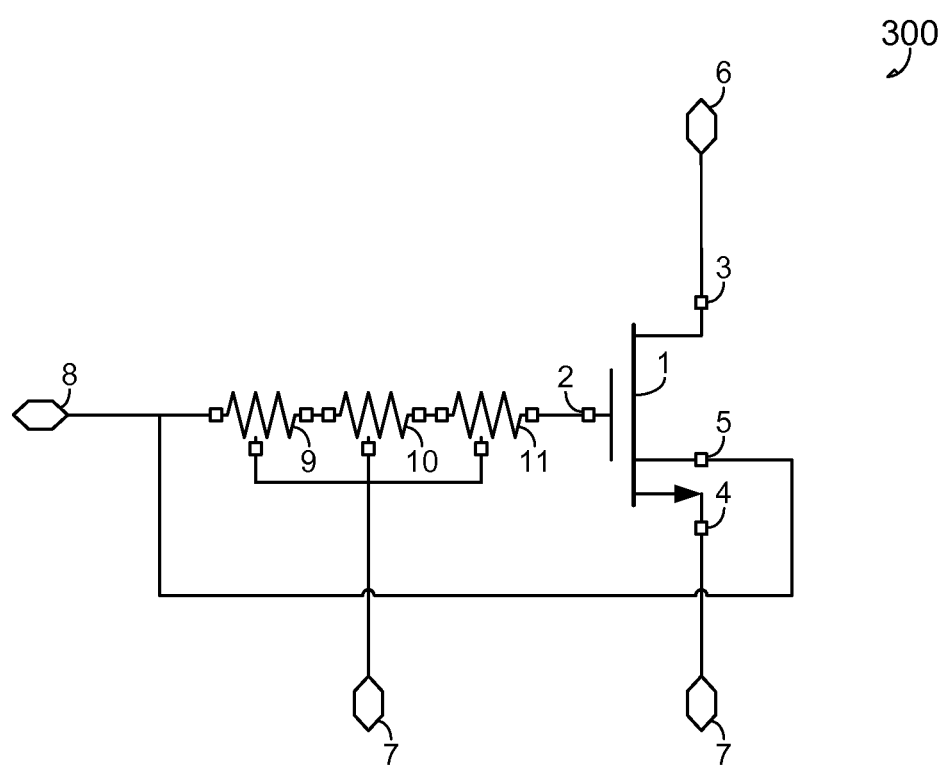

FIGS. 1-3 illustrate generally example biased electrostatic discharge (ESD) circuits configured to provide an ESD path to ground through an ESD device 1, such as an n-type metal oxide semiconductor (NMOS) transistor, having a gate terminal 2, a drain terminal 3, a source terminal 4, and a bulk terminal 5 (e.g., a p-epi/pbulk terminal). The biased ESD circuits of FIGS. 1-3 use a negative voltage applied (e.g., externally applied) to a bulk terminal (e.g., p-epi/pbulk) of an ESD device to reduce the source/drain capacitance (e.g., capacitance between the n+source/drain and the bulk) of the ESD device, reverse biasing the well to drain capacitance of the ESD device, and reducing the capacitance load on a protected net (PAD) without reducing the clamping nature of the underlying ESD structure.

FIG. 1 illustrates generally an example biased ESD circuit 100 including an ESD device 1, a protected net (PAD) 6, a ground connection 7, a negative bias 8, and a resistor 9. The ESD device 1 can include an isolated n-type metal oxide semiconductor (NMOS) transistor. In other examples, one or more other ESD devices can be used.

The gate terminal 2 is coupled to the source terminal 4 through the resistor 9. In certain examples, coupling the gate terminal 2 to ground 7 through the resistor 9 keeps the ESD device 1 in an off state regardless of the value of the negative bias 8. The drain terminal 3 is coupled to the PAD 6, and is configured to receive an ESD event. The source terminal 4 is coupled to ground 7. The ESD device 1 is configured to provide an ESD discharge path for an ESD event between the drain terminal 3 and the source terminal 4.

The bulk terminal 5 is configured to receive a negative bias 8 to reduce the drain terminal 3 to source terminal 4 capacitance of the ESD device 1. In an example, the biased ESD circuit 100 can include a charge pump configured to provide the negative bias 8 to the bulk terminal 5. In an example, the negative bias 8 can be more negative than the value of the source terminal 4 of the ESD device 1. In certain examples, the source terminal 4 is coupled to ground. Accordingly, the negative bias 8 can be a voltage lower than ground. In other examples, the negative bias 8 can be more negative than the lowest voltage on the PAD 6 coupled to the drain terminal 3.

FIG. 2 illustrates generally an example biased ESD circuit 200 including an ESD device 1, a protected net (PAD) 6, a ground connection 7, a negative bias 8, and first, second, and third resistors 9, 10, 11. The biased ESD circuit 200 can reduce leakage current from charge coupling between the drain and the gate in the presence of large transients at the PAD 6.

The first, second, and third resistors 9, 10, 11 can include three-terminal, resistors (e.g., three-terminal, semiconductor transistors used as a resistor) coupled in series. In an example, the gates of the first, second, and third resistors 9, 10, 11 can be coupled to ground 7, and the gate terminal 2 of the ESD device 1 can be coupled to ground 2 through the first, second, and third resistors 9, 10, 11.

The drain terminal 3 is coupled to the PAD 6, and is configured to receive an ESD event. The source terminal 4 is coupled to ground 7. Accordingly, the source terminal 4 is coupled to the gate terminal 2 through the first, second, and third resistors 9, 10, 11. The ESD device 1 is configured to provide an ESD discharge path for an ESD event between the drain terminal 3 and the source terminal 4. The bulk terminal 5 is configured to receive the negative bias 8 to reduce the drain terminal 3 to source terminal 4 capacitance of the ESD device 1.

FIG. 3 illustrates generally an example biased ESD circuit 300 including an ESD device 1, a protected net (PAD) 6, a ground connection 7, a negative bias 8, and first, second, and third resistors 9, 10, 11.

The first, second, and third resistors 9, 10, 11 can include three-terminal, resistors (e.g., three-terminal, semiconductor transistors used as a resistor) coupled in series. In an example, the gates of the first, second, and third resistors 9, 10, 11 can be coupled to ground 7.

The gate terminal 2 of the ESD device 1 is coupled to the negative bias 8 through the first, second, and third resistors 9, 10, 11. The drain terminal 3 is coupled to the PAD 6, and is configured to receive an ESD event. The source terminal 4 is coupled to ground 7. The ESD device 1 is configured to provide an ESD discharge path for an ESD event between the drain terminal 3 and the source terminal 4. The bulk terminal 5 is coupled to the negative bias 8, and to the gate terminal 2 through the first, second, and third resistors 9, 10, 11.

Figure 4:
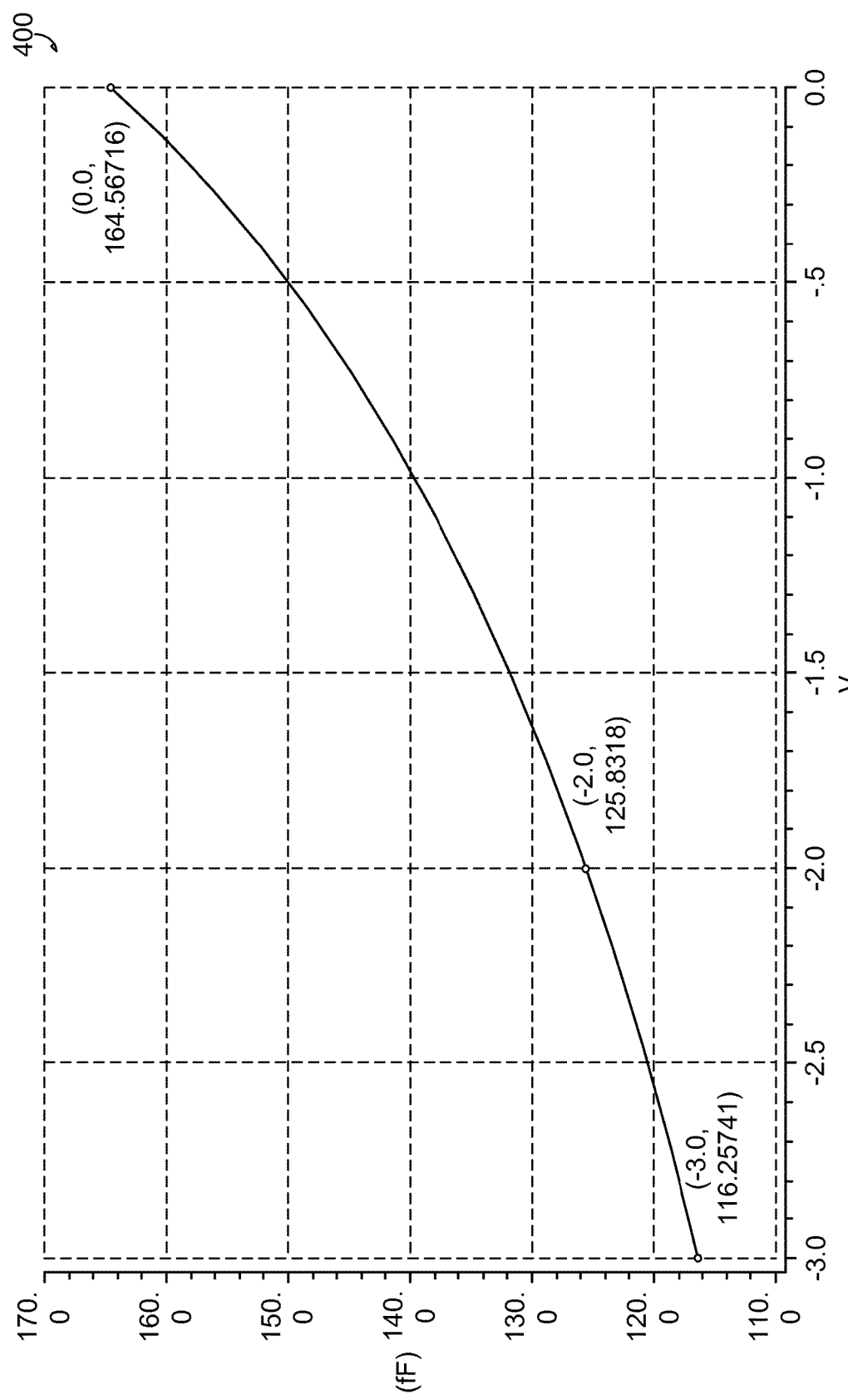
FIG. 4 illustrates generally an example simulation output of negative bias ($V_{CP}$) on ESD circuit capacitance (F).

FIG. 4 illustrates generally an example simulation output 400 of negative bias ($V_{CP}$) on ESD circuit capacitance (F). Existing ESD circuits are biased at 0V, having a bulk terminal coupled to a source terminal of an ESD device. The example simulation output 400 illustrates three data points: a first data point at 0.0V bias, with an ESD circuit capacitance of 164.56716 femtofarads; a second data point at −2.0V bias, with an ESD circuit capacitance of 125.8318 femtofarads; and a third data point at −3.0V bias, with an ESD circuit capacitance of 116.25741 femtofarads.

Additional Notes and Examples

In Example 1, a biased electrostatic discharge (ESD) circuit includes an ESD device having a gate terminal, a source terminal, a drain terminal, and a bulk terminal, wherein the ESD device is configured to provide an ESD discharge path between the drain terminal and the source terminal, and wherein the bulk terminal of the ESD device is configured to receive negative bias to reduce the drain terminal to source terminal capacitance of the ESD device.

In Example 2, the source terminal of the ESD device of Example 1 is optionally coupled to ground.

In Example 3, any one or more of Examples 1-2 optionally includes a charge pump coupled to the bulk terminal of the ESD device, wherein the charge pump is optionally configured to provide the negative bias to the bulk terminal.

In Example 4, the negative bias of any one or more of Examples 1-3 is optionally more negative than the value of the source terminal of the ESD device.

In Example 5, any one or more of Examples 1-4 optionally includes a resistor coupled between the gate terminal and the source terminal of the ESD device.

In Example 6, any one or more of Examples 1-5 optionally includes a resistor coupled between the gate terminal and the bulk terminal of the ESD device.

In Example 7, the ESD device of any one or more of Examples 1-6 optionally includes an n-type metal oxide semiconductor (NMOS) transistor.

In Example 8, the drain terminal of the NMOS transistor of any one or more of Examples 1-7 is optionally configured to receive an ESD event and to discharge the ESD event through the source terminal of the NMOS transistor to ground.

In Example 9, a biased electrostatic discharge (ESD) system includes an ESD device having a gate terminal, a source terminal, a drain terminal, and a bulk terminal, wherein the ESD device is configured to provide an ESD discharge path between the drain terminal and the source terminal. The ESD system includes a charge pump configured to provide a negative bias to the bulk terminal of the ESD device, wherein the gate terminal of the ESD device is coupled to the source terminal of the ESD device.

In Example 10, the source terminal of the ESD device of any one or more of Examples 1-9 is optionally coupled to ground.

In Example 11, any one or more of Examples 1-10 optionally includes a resistor coupled between the gate terminal and the source terminal of the ESD device, and the source terminal of the ESD device of any one or more of Examples 1-10 is optionally directly coupled to ground.

In Example 12, the negative bias of any one or more of Examples 1-11 is optionally more negative than the value of the source terminal of the ESD device.

In Example 13, the ESD device of any one or more of Examples 1-12 optionally includes an n-type metal oxide semiconductor (NMOS) transistor, and the drain terminal of the NMOS transistor of any one or more of Examples 1-12 is optionally configured to receive an ESD event and to discharge the ESD event through the source terminal of the NMOS transistor to ground.

In Example 14, a method to reduce the capacitance of an electrostatic discharge (ESD) circuit includes providing an ESD discharge path between a drain terminal and a source terminal of an ESD device; providing a negative bias to a bulk terminal of the ESD device to reduce the drain terminal to source terminal capacitance of the ESD device.

In Example 15, the source terminal of the ESD device of any one or more of Examples 1-14 is optionally coupled to ground.

In Example 16, the providing the negative bias to the bulk terminal of the ESD device of any one or more of Examples 1-15 optionally includes using a charge pump coupled to the bulk terminal of the ESD device.

In Example 17, the negative bias of any one or more of Examples 1-16 is optionally more negative than the value of the source terminal of the ESD device.

In Example 18, the gate terminal of any one or more of Examples 1-17 is optionally coupled to the source terminal of the ESD device through a resistor.

In Example 19, the gate terminal of any one or more of Examples 1-18 is optionally coupled to the bulk terminal of the ESD device through a resistor.

In Example 20, the ESD device of any one or more of Examples 1-19 optionally includes an n-type metal oxide semiconductor (NMOS) transistor, and providing the ESD discharge path of any one or more of Examples 1-19 optionally includes receiving an ESD event at a drain terminal of the NMOS transistor and discharging the ESD event through the source terminal of the NMOS transistor to ground.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A biased electrostatic discharge (ESD) circuit, comprising:
    an ESD device including a gate terminal, a source terminal, a drain terminal, and a bulk terminal, wherein the ESD device is configured to provide an ESD discharge path between the drain terminal and the source terminal; and
    at least one three-terminal resistor coupled between the gate terminal of the ESD device and the bulk terminal of the ESD device, the at least one three-terminal resistor having a gate terminal coupled to ground,
    wherein the bulk terminal of the ESD device is configured to receive negative bias to reduce the drain terminal to source terminal capacitance of the ESD device.

2. The biased ESD circuit of claim 1, wherein the source terminal of the ESD device is coupled to ground.

3. The biased ESD circuit of claim 1, including:
    a charge pump coupled to the bulk terminal of the ESD device, wherein the charge pump is configured to provide the negative bias to the bulk terminal.

4. The biased ESD circuit of claim 1, wherein the negative bias is more negative than a voltage of the source terminal of the ESD device.

5. The biased ESD circuit of claim 1, wherein the at least one three-terminal resistor includes first, second, and third series-connected, three-terminal resistors, each of the first, second, and third series-connected, three-terminal resistors having a gate terminal coupled to ground.

6. The biased ESD circuit of claim 1, wherein the ESD device includes an n-type metal oxide semiconductor (NMOS) transistor.

7. The biased ESD circuit of claim 6, wherein the drain terminal of the NMOS transistor is configured to receive an ESD event and to discharge the ESD event through the source terminal of the NMOS transistor to ground.

8. A biased electrostatic discharge (ESD) system, comprising:
    an ESD device including a gate terminal, a source terminal, a drain terminal, and a bulk terminal, wherein the ESD device is configured to provide an ESD discharge path between the drain terminal and the source terminal;
    a charge pump configured to provide a negative bias to the bulk terminal of the ESD device; and
    at least one three-terminal resistor coupled between the gate terminal of the ESD device and the bulk terminal of the ESD device, the at least one three-terminal resistor having a gate terminal coupled to ground.

9. The biased ESD system of claim 8, wherein the source terminal of the ESD device is coupled to ground.

10. The biased ESD system of claim 8, wherein the negative bias is more negative than a voltage of the source terminal of the ESD device.

11. The biased ESD system of claim 8, wherein the ESD device includes an n-type metal oxide semiconductor (NMOS) transistor, and
    wherein the drain terminal of the NMOS transistor is configured to receive an ESD event and to discharge the ESD event through the source terminal of the NMOS transistor to ground.

12. A method to reduce a capacitance of an electrostatic discharge (ESD) circuit, comprising:

providing an ESD discharge path between a drain terminal and a source terminal of an ESD device; and providing a negative bias to a bulk terminal of the ESD device to reduce the drain terminal to source terminal capacitance of the ESD device, wherein a gate terminal of the ESD device is coupled to the bulk terminal of the ESD device through a resistor, the resistor including at least one three-terminal resistor having a gate terminal coupled to ground.

13. The method of claim 12, wherein the source terminal of the ESD device is coupled to ground.

14. The method of claim 12, wherein providing the negative bias to the bulk terminal of the ESD device includes using a charge pump coupled to the bulk terminal of the ESD device.

15. The method of claim 12, wherein the negative bias is more negative a voltage of the source terminal of the ESD device.

16. The method of claim 12, wherein the at least one three-terminal resistor includes first, second, and third series-connected, three-terminal resistors, each of the first, second, and third series-connected, three-terminal resistors having a gate terminal coupled to ground.

17. The method of claim 12, wherein the ESD device includes an n-type metal oxide semiconductor (NMOS) transistor, and wherein providing the ESD discharge path includes receiving an ESD event at a drain terminal of the NMOS transistor and discharging the ESD event through the source terminal of the NMOS transistor to ground.

* * * * *